(12) United States Patent
Chen

(10) Patent No.: US 6,303,484 B1
(45) Date of Patent: Oct. 16, 2001

(54) METHOD OF MANUFACTURING DUMMY PATTERN

(75) Inventor: Wei-Shiau Chen, Chin-Men Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/482,138

(22) Filed: Jan. 12, 2000

(51) Int. Cl.[7] ............... H01L 21/3205; H01L 21/4763
(52) U.S. Cl. .................... 438/595; 438/631; 438/633; 438/926
(58) Field of Search .................... 438/595, 926, 438/631, 633, 622

(56) References Cited

U.S. PATENT DOCUMENTS

| 5,639,697 | * | 6/1997 | Weling et al. ............ 438/633 |
| 5,861,342 | * | 1/1999 | Gabriel et al. ............ 438/631 |

* cited by examiner

*Primary Examiner*—Amir Zarabian
*Assistant Examiner*—Christian D. Wilson

(57) ABSTRACT

A method of fabricating a dummy pattern is proposed. A semiconductor substrate is divided into a dense region and a sparse region. Conducting patterns are formed on the dense region. A dielectric layer is formed over the substrate and the conducting patterns. Photoresist patterns are formed on the dielectric layer above the sparse region. The dielectric layer is etched back to form a plurality of spacers on the sidewall of the conducting patterns, and simultaneously, a plurality of dummy patterns are formed on the sparse region.

10 Claims, 4 Drawing Sheets

METHOD OF MANUFACTURING DUMMY PATTERN

BACKGROUND OF THE INVENTION

1. Field of the Invention

The present invention relates to a method of manufacturing dummy patterns. More particularly, the present invention relates to a method of forming dummy patterns and spacers of a gate structure, simultaneously.

2. Description of the Related Art

Planarization is very important in ULSI technology. It can provide a smooth surface to ensure good metal step coverage and to provide a flat-enough field so that, within the lithography depth of focus, contact vias and metal wires can be patterned.

A true global planarization can be achieved by chemical/mechanical polishing (CMP) of an inter-layer dielectric (ILD). FIGS. 1A to 1E show cross-sectional views of the conventional processes of CMP. Referring to FIG. 1A, polysilicon patterns 102a, 102b, and 102c are formed on the substrate 100. As shown in FIG. 1A, the poly patterns 102a, 102b, 102c are densely arranged in region 101a, in what is called a dense region. In contrast, the region 101b is an open area called sparse region.

Referring to FIG. 1B, an oxide layer 104 is formed on the substrate 100 and covers the poly patterns 102a, 102b, and 102c.

Referring to FIG. 1C, the oxide layer 104 is etched back to form spacers 104a, 104b, and 104c.

Referring to FIG. 1D, an ILD layer 106 is blanket-formed over the entire surface of substrate 100, which surface includes both the dense region 101a and the sparse region 101b. As shown in FIG. 1D, the poly patterns cause a rough topography on the surface of ILD layer 106.

Referring to FIG. 1E, the surface topography of the ILD layer 106 caused by previously formed polysilicon can be smoothed by polishing the ILD layer 106 with CMP.

However, the dense region 101a and sparse region 101b have different device densities. Therefore, as shown as FIG. 1E, the two regions have different polishing rates. As a result, a dishing effect occurs and reduces the resolution of lithography.

SUMMARY OF THE INVENTION

The invention provides a method for fabricating a dummy pattern, comprising the following steps. A semiconductor substrate having a dense region and a sparse region is provided. Conducting patterns are formed on the dense region. A dielectric layer is formed over the substrate and the conducting patterns. Photoresist patterns are formed on the dielectric layer above the rare region. The dielectric layer is etched back to form a plurality of spacers on the sidewalls of the conducting patterns, and, simultaneously, a plurality of dummy patterns is formed on the sparse region. The photoresist patterns are removed.

As embodied and broadly described herein, an inter-dielectric layer is further formed over the substrate to cover the conducting patterns and the dummy patterns after the dummy patterns are formed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A to 2E are schematic, cross-sectional views showing a method of fabricating dummy patterns according to one preferred embodiment of this invention.

Figure 1A:
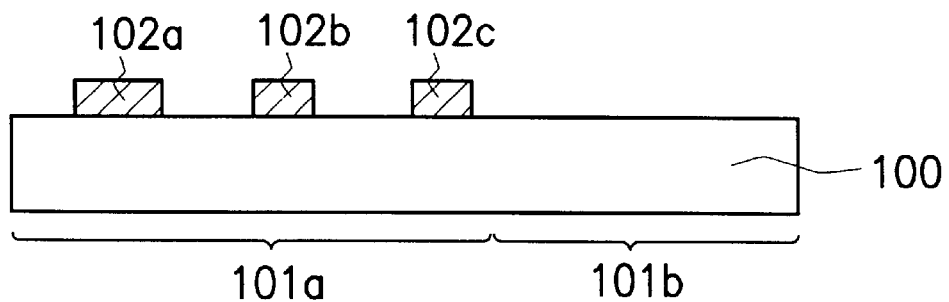
FIGS. 1A to 1E are schematic, cross-sectional views of the conventional processes of CMP.
Figure 1B:
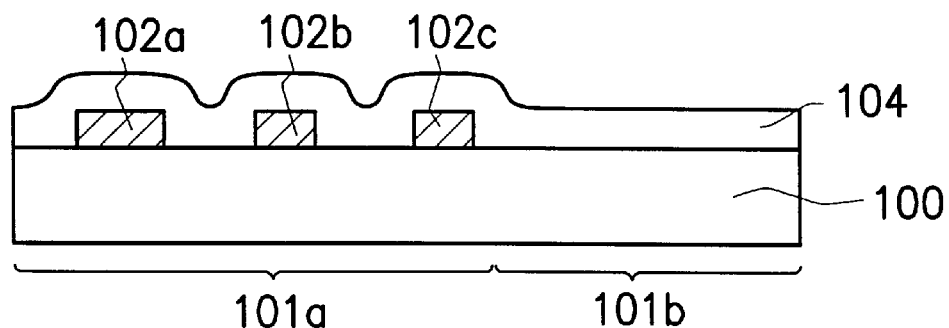
Figure 1C:
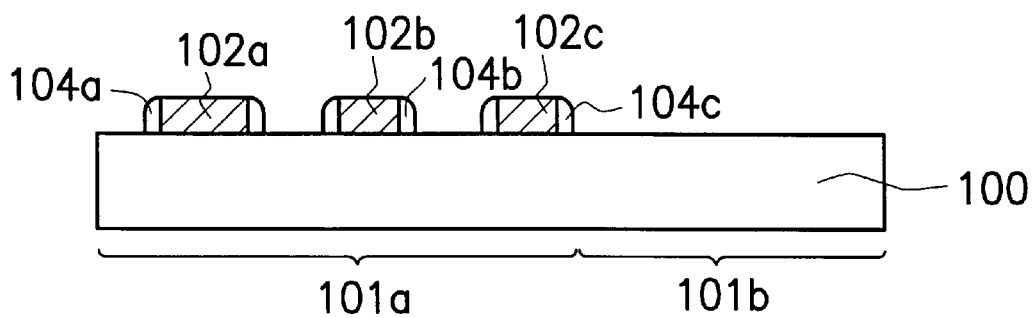
Figure 1D:
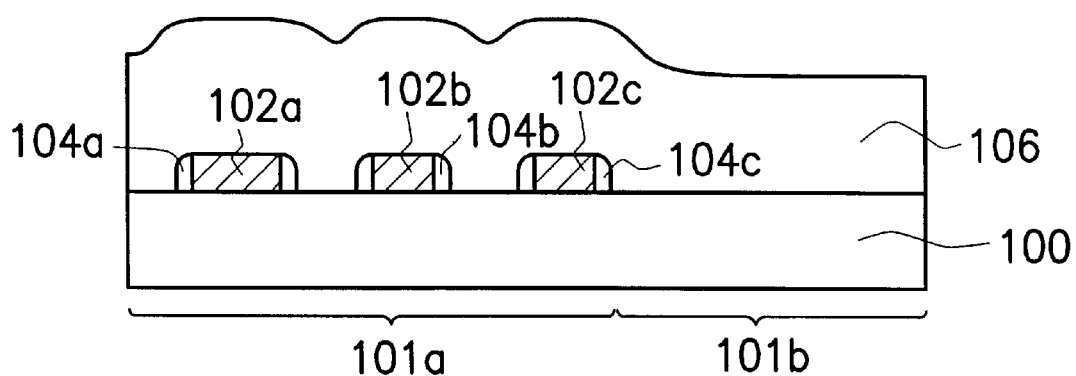
Figure 1E:
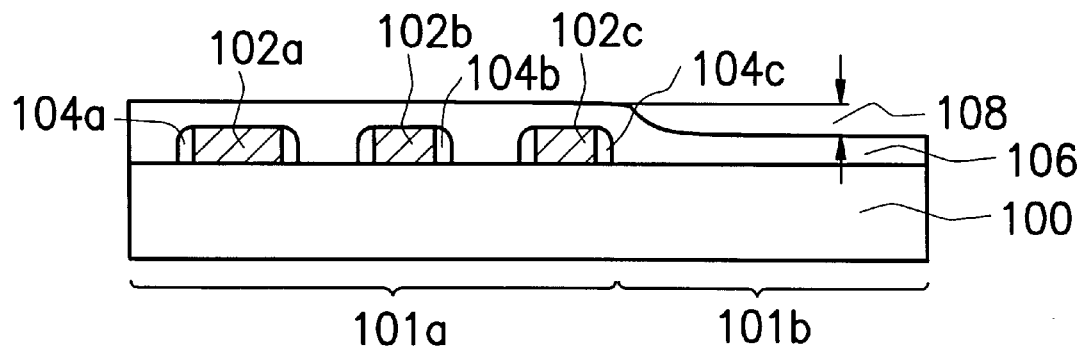
Figure 2A:
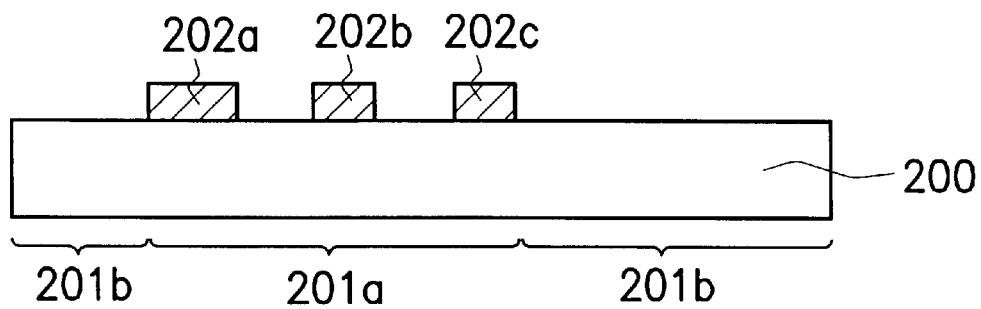
FIGS. 2A to 2E are the schematic, cross-sectional views of a process of fabricating dummy patterns according to one preferred embodiment of this invention.

Referring to FIG. 2A, conducting patterns 202a, 202b, 202c having sidewalls are formed on the substrate 200. The conducting patterns 202a, 202b, 202c may be made metal, polysilicon or polycide. For example, the conducting patterns 202a, 202b, 202c can be made of polysilicon. A polysilicon layer is first deposited on the substrate 200 by chemical vapor deposition. Then, the polysilicon layer is patterned and etched to form the conducting patterns 202a, 202b, and 202c. The conducting patterns 202a, 202b, 202c are densely arranged in dense region 201a. In contrast, the sparse region 201b is an open area.

Figure 2B:
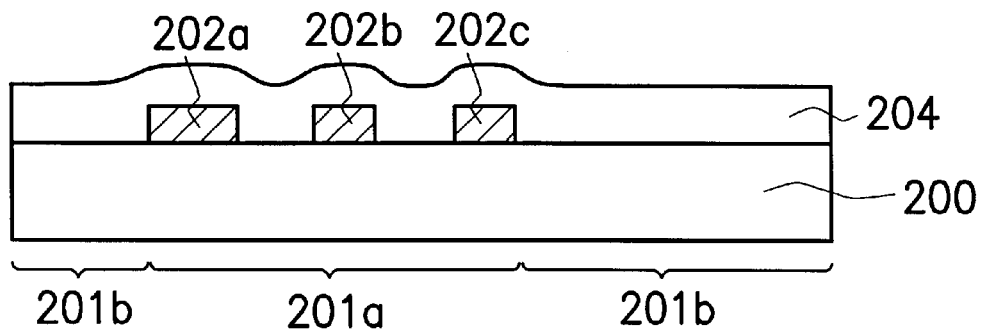

Referring to FIG. 2B, a dielectric layer 204 is formed on the substrate 200 and covers the conducting patterns 202a, 202b, and 202c. For example, the dielectric layer 204 may be made of silicon oxide or silicon nitride by CVD. Preferably, the dielectric layer has a thickness the same as that of the conducting patterns 202a, 202b, and 202c.

Figure 2C:
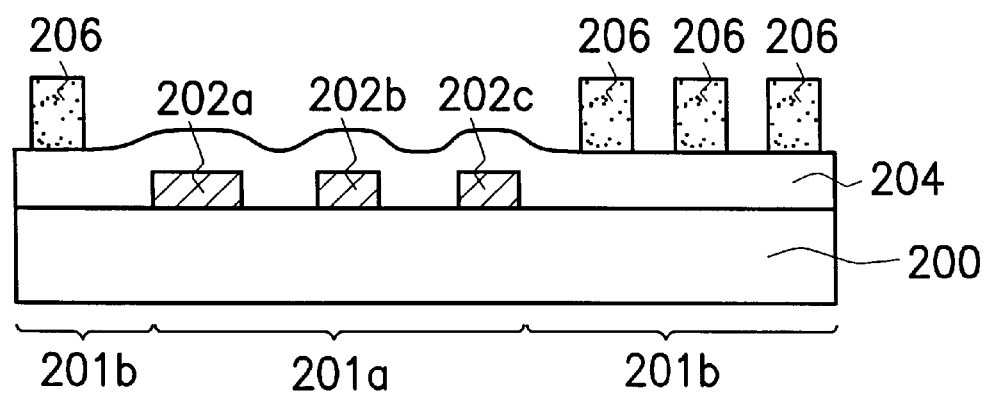

Referring to FIG. 2C, photoresist patterns are formed on the dielectric layer above the sparse region 201b by conventional lithographic technology.

Figure 2D:
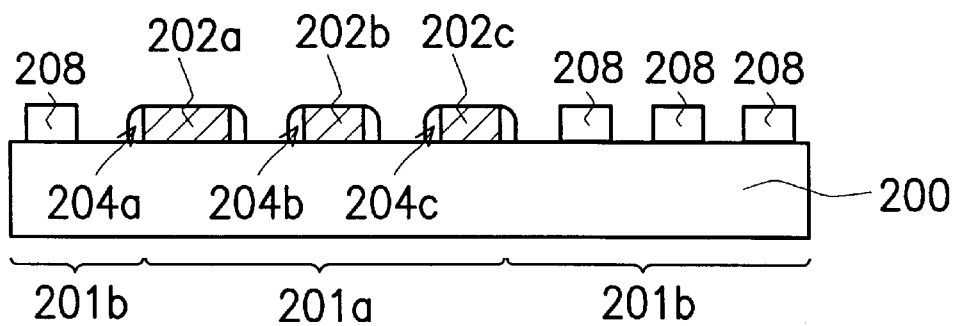

Referring to FIG. 2D, the dielectric layer 204 is etched back to form spacers 204a, 204b, and 204c on the sidewalls of the conducting patterns 202a, 202b, and 202c, respectively. Simultaneously, dummy patterns 208 are formed on the sparse region 201b while using the photoresist 206 as a hard mask.

Figure 2E:
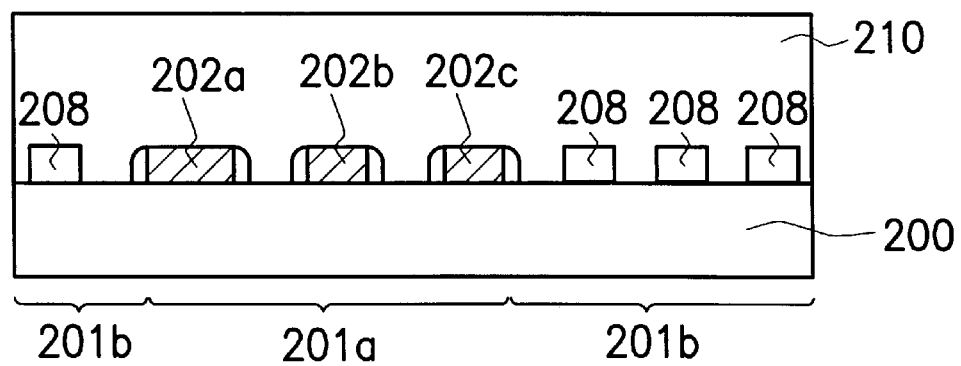

Referring to FIG. 2E, the photoresist patterns are removed. Then, an ILD layer 210 is blanket-formed over the entire surface of substrate 200 and covers the dummy patterns 208 and conducting patterns 202. For example, the ILD layer 210 may be made of silicon oxide or silicon nitride. Thereafter, the ILD layer 210 is planarized by CMP.

The existence of the dummy patterns 208 reduces the device density difference between the dense region 201a and the sparse region 201b. Therefore, the uniformity of ILD planarization can be improved.

Figure 3:
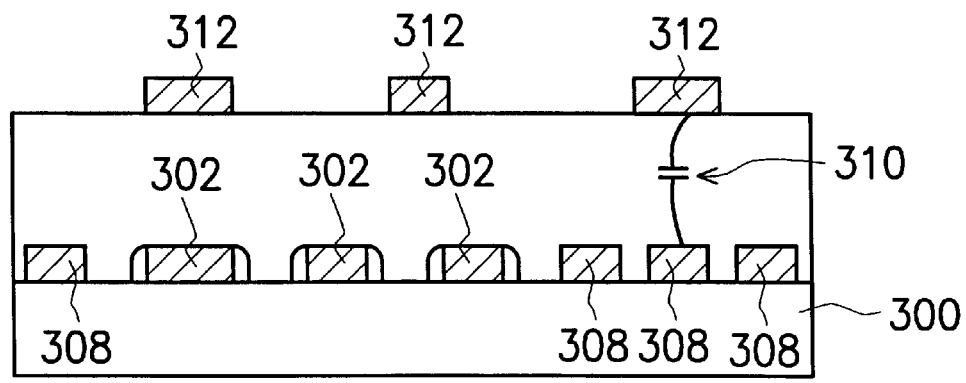
FIG. 3 is a schematic, cross-sectional view of poly dummy patterns.

Referring to FIG. 3, it is noted that the dummy pattern can be made of polysilicon, and can be formed simultaneously with conducting patterns. However, this causes another problem. Poly dummy patterns will cause the wiring capacitance to increase since the polysilicon is a conducting material. Accordingly, an inactive dummy pattern, such as one made from oxide, is preferable in this invention.

1. The dishing effect is improved by providing the dummy patterns.

2. The dummy patterns are formed simultaneously with the spacers. The process is simpler than the conventional process.

3. The inactive dummy patterns are used to avoid capacitance between wires and poly dummy patterns.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a dummy pattern, comprising:

providing a substrate having a dense region and a sparse region;

forming a plurality of conducting patterns having sidewalls on the dense region;

forming a dielectric layer over the dense region, and the conducting patterns and the sparse region;

forming a plurality of photoresist patterns on the dielectric layer above the sparse region;

etching back the dielectric layer to form spacers on the sidewalls of the conducting patterns, and simultaneously forming a plurality of dummy patterns on the sparse region while using the photoresist patterns as a mask;

removing the photoresist patterns;

forming an inter-layer dielectric layer on the conducting patterns and the dummy patterns; and planarizing the inter-layer dielectric layer by performing a chemical mechanical polishing (CMP) process to the inter-layer dielectric layer.

2. The method of claim 1, wherein the dielectric layer comprises silicon oxide.

3. The method of claim 1, wherein a thickness of the dielectric layer is substantially equal to a thickness of the conducting patterns.

4. The method of claim 1, wherein the conducting patterns are made of polysilicon.

5. A method for fabricating dummy pattern, comprising:

providing a substrate having a dense region and a sparse region;

forming a plurality of conducting patterns on the dense region;

forming a plurality of dummy patterns with a dielectric material on the sparse region;

forming an inter-layer dielectric layer on and adjacent to the conducting patterns and the dummy patterns; and planarizing the inter-layer dielectric layer by chemical mechanical polishing.

6. The method of claim 5, wherein a plurality of spacers is formed on sidewalls of the conducting patterns simultaneous with formation of the dummy patterns.

7. The method of claim 6, wherein the formation of the dummy patterns and the spacer comprises:

forming a dielectric layer on the substrate and covering the conducting patterns;

forming a plurality of photoresist patterns on the dielectric layer above the sparse region;

anisotropically etching the dielectric to form spacers on the sidewalls of the conducting patterns and forming the dummy patterns on the sparse region while using the photoresist patterns as a mask.

8. The method of claim 7, wherein the dielectric material comprises oxide.

9. The method of claim 7, wherein a thickness of the dielectric layer is substantially equal to a thickness of the conducting patterns.

10. The method of claim 5, wherein the conducting patterns are made of polysilicon.

* * * * *